United States Patent [19]
Reynolds et al.

[11] Patent Number: 6,158,491
[45] Date of Patent: Dec. 12, 2000

[54] PROCESS FOR THE CORROSION PROTECTION OF COPPER OR COPPER ALLOYS

[75] Inventors: John Reynolds, West Lothian; Andrew McIntosh Soutar, London; Keith William Peter White, Kidlington; Anthony Williams, Milton Keynes, all of United Kingdom

[73] Assignee: Cookson Group PLC, London, United Kingdom

[21] Appl. No.: 08/860,074

[22] PCT Filed: Dec. 13, 1995

[86] PCT No.: PCT/GB95/02912

§ 371 Date: Aug. 28, 1997

§ 102(e) Date: Aug. 28, 1997

[87] PCT Pub. No.: WO96/20295

PCT Pub. Date: Jul. 4, 1996

[30] Foreign Application Priority Data

Dec. 23, 1994 [GB] United Kingdom .................... 9426087
Apr. 10, 1995 [GB] United Kingdom .................... 9507419

[51] Int. Cl.[7] ...................................................... B32B 31/00
[52] U.S. Cl. .......................... 156/390; 156/345; 428/209; 427/305; 427/443.1; 427/444
[58] Field of Search .................................. 427/96, 98, 97; 156/625, 630, 629; 420/532, 535, 544, 553, 541, 540; 148/439, 440, 550, 553, 551; 106/1.23; 260/114, 413 S; 428/209

Primary Examiner—Merrick Dixon
Attorney, Agent, or Firm—Mintz, Levin, Cohn, Ferris, Glovsky and Popeo, P.C.

[57] ABSTRACT

A process for the corrosion protection of copper or copper alloy which process comprises contacting the surface with an aqueous solution of at least one compound of general formula (I), wherein X is N, Y is CR and Z is N, or X is N, Y is N and Z is N or CR or X is CR, Y is N and Z is N, where R is a hydrogen atom or $R^1$, and $R^1$ is an alkyl, aryl, aralkyl, halogen, trihalomethyl, amino, heterocyclic, $NHR^2$, $NR^3R^4$, CN, $CO_2H$, $CO_2R^5$, OH or $OR^6$ group, where each of $R^2$ to $R^6$ independently represents an alkyl, aryl, or aralkyl group.

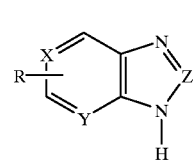

(I)

11 Claims, No Drawings

PROCESS FOR THE CORROSION PROTECTION OF COPPER OR COPPER ALLOYS

The present invention relates to a process for the corrosion protection of copper or copper alloys and, in particular, to a process for the corrosion protection of copper or copper alloys to provide thermal and humidity protection.

Preflux coatings are used to protect both rigid and flexible printed circuit boards (PCBs). Various preflux coatings have been described in the prior art. Initially, benzotriazoles were used as preflux coating but at the present time the commercial preflux treatments are based upon imidazoles or benzimidazoles.

EP-A-0364132 disclosed a process for the preflux treatment of copper using an aqueous solution comprising a compound capable of generating copper or zinc ions and an imidazole having a $C_{5-21}$ alkyl group at the 2-position thereof.

EP-A-0428383 discloses the use as a preflux coating of a benzimidazole compound having an alkyl group of at least 3 carbon atoms at the 2-position thereof and an organic acid.

JP-A-06002158 discloses the use as a preflux treatment agent of various 2-(phenylalkyl)-benzimidazoles, such as 2-(p-chlorobenzyl)-benzimidazole.

None of the prior art preflux coatings can be considered to be entirely satisfactory because limited thermal and/or humidity protection are given by these systems.

We have now developed a process for the preflux treatment of copper or copper alloys, in particular to protect rigid and flexible copper or copper alloy printed circuit boards, which provides improved protection and overcomes the disadvantage of the prior art processes.

Accordingly, the present invention provides a process for the corrosion protection of copper or a copper alloy which process comprises contacting the surface with an aqueous solution of at least one compound of the general formula:

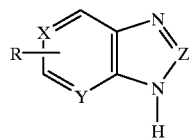

wherein X is N, Y is CR and Z is N, or X is N, Y is N and Z is N or CR, or X is CR, Y is N and Z is N, where R is a hydrogen atom or $R^{14}$, and $R^1$ is an alkyl aryl, aralkyl, halogen, trihalomethyl, amino, heterocyclic, $NHR^2$, $NR^3R^4$, CN, $CO_2H$, $CO_1R^5$, OH or $OR^6$ group, where each of $R^2$ to $R^6$ independently represents an alkyl, aryl or aralkyl group.

In the definitions of the substituent groups given above, alkyl groups preferably have from 1 to 20 carbon atoms, more preferably 1 to 6 carbon atoms; aryl groups are preferably phenyl or naphthyl groups; aralkyl groups are preferably phenyl or naphthyl groups substituted with one or more alkyl groups containing 1 to 20 carbon atoms; and heterocyclic groups are preferably furfuryl, benzotriazolyl, imidazolyl and benzimidazolyl.

The aqueous solution treatment of the present invention forms a ligand coating on the surface of the copper or copper alloy which protects the copper or copper alloy surface during storage. The ligand coating is particularly suited to the surface mounting of components thereon since it is solderable, i.e. can be removed by a suitable flux and wetted by solder, and has excellent heat resistance and long term storage stability.

Particularly preferred compounds of Formula I for use in the present invention are the triazole pyridines of the formulae:

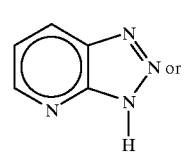
(II)

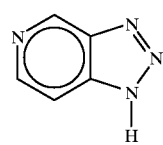
(III)

and purine, 6-aminopurine, 6-chloropurine, 2, 6-dichloropurine, 6-methoxypurine, 6-histaminopurine and 6-furfurylaminopurine.

The compounds of Formula I for use in the present invention are compounds which all contain four or five heterocyclic nitrogen atoms. Thus, the triazole-pyridines have one more nitrogen atom then the benzo-triazoles and the purines have two more nitrogen atoms then the corresponding benzimidazoles. The triazole pyridines and the purines generally have higher melting points than the corresponding benzotriazoles and benzimidazoles, and it is believed that this is related to the thermal stability of the complex formed at the copper or copper alloy surface. It is also believe that the extra nitrogen atoms in the compounds as compared to the prior art compounds gives rise to a greater number of sites for bonding to metal surfaces and metal ions.

The compounds of Formula (I) may be used in admixture, or in admixture with the compounds previously proposed for use in the preflux treatment of copper or copper alloys.

Some of the compounds of Formula (I) are not very soluble in water and, accordingly, the compound may be formed into an aqueous solution using an organic or inorganic acid. Examples of organic acids that can be used for this purpose include acetic acid, acrylic acid, adipic acid, benzoic acid, citric acid, 2-dimethylol propionic acid, formic acid, fumaric acid, maleic acid, oxalic acid, propionic acid, salicylic acid, succinic acid or tartaric acid, and examples of inorganic acid include hydrochloric acid, nitric acid, phosphoric acid or sulfuric acid.

Even if the compound of Formula (I) is water soluble, the aqueous coating solution is preferably buffered by the addition of ammonia tetraalkyl-ammonium hydroxide, amines, alkali metal hydroxides, phosphates or borates in addition to the above acids. Aqueous solutions of the compound of Formula (I) may be prepared in the pH range of from 2 to 14.

The aqueous solution of the compound of Formula (I) may be applied to the copper or copper alloy surface by immersion, spraying or other coating techniques.

It is also possible to incorporate into the aqueous solution one or more titanium, vanadium, chromium, manganese, iron, cobalt, nickel, copper or zinc compounds in an amount of from 0.01 to 10% by weight based on the weight of the compound of Formula (I). These salts either accelerate the rate of coating and/or improve the thermal and humidity resistance of the coating. Furthermore, nickel and zinc will form their respective metal-ligand coatings on the copper surface.

Copper compounds which may be used include copper acetate, bromides, chlorides, hydroxide, nitrate, phosphate or sulfate. Nickel compounds which may be used include nickel acetate, bromide, chloride, hydroxide, nitrate, phosphate or sulphate, whilst zinc compounds which may be used include zinc acetate, benzoate, bromide, chloride, citrate, formate, nitrate, oxide, oxalate, phosphate, salicylate or tartarate.

Preferred conditions for treating the copper or copper alloy are to maintain the aqueous solution of the compound of Formula (I) at a temperature of from 20 to 60° C. and allow the solution to contact the surface to be treated for a period of from 1 second to 5 minutes, preferably from 30 seconds to 2 minutes.

The process of the present invention may be used to protect the surface of any copper or copper alloy article. It is, however, particularly valuable for the treatment of both rigid and flexible printed circuit boards.

The present invention thus includes within its scope a rigid or flexible printed circuit board which has been coated by the process of the invention.

The present invention will be further described with reference to the non-limiting Examples.

The general procedures used throughout the Examples are detailed below.

1. Cooper Coupon Preparation

Copper coupons (copper laminate plated with 20 microns of copper) were degreased with isopropyl alcohol and etched with the following solution at room temperature for 2 minutes:

| | | |
|---|---|---|
| Potassium peroxymonosulfate | 6.0% w/w | |
| Copper sulfate | 0.5% w/w | |
| Sulfuric acid | 0.5% w/w | |
| Deionised water | balance | |

The etched coupons were then rinsed with tap water, then with sulfuric acid and then with tap water again. The samples were then rinsed with isopropyl alcohol and dried in warm water.

2. Coating Solution

Coating solutions were made up by dissolving or forming a suspension of the ligand (0.5%) in water (99.5%). The pH of the solution was then adjusted to 2.5 with glacial acetic acid. The pH was then adjusted to various pHs, up to pH 11, with sodium hydroxide (20% w/w).

Etched copper coupons were coated for 2 minutes with the coating solution at 40° C. After removal from the coating solution, samples were rinsed with deionised water, and warm air dried.

The presence of a coating was inferred by either dewetting effects occurring as the sample was removed from the coating solution and rinsed or by carrying out a silver spot test. The coupons were left to age for ca. 18 h before carrying out heat treatment testing, and humidity ageing/heat treatment testing.

3. Heat Treatment Test

Coated copper coupons were heated in an oven at 220° C. The samples were removed 10 seconds after their temperature had reached 200° C. The samples were passed through five such cycles. The heat tarnish resistance was assessed relative to bare copper. The coatings were rated as:

POOR—coated samples tarnished more readily than bare copper

SATISFACTORY—tarnishing comparable with bare copper

GOOD—improved tarnish resistance over bare copper.

4. Humidity ageing/heat treatment test

Coated copper coupons of copper clad laminate were stored at 40° C./95% RH for 72 hours in a humidity cabinet. The humidity tarnish resistance was assessed relative to bare copper. The coatings were rated as:

POOR, SATISFACTORY OR GOOD as discussed above.

The humidity aged coated coupons of copper clad laminate were then heated in an oven at 200° C. The samples were removed 10 seconds after their temperature had reached 200° C. The samples were passed through five such cycles. Heat tarnish resistance was assessed relative to bare copper. The coating were rated as:

POOR, SATISFACTORY OR GOOD as discussed above.

5. Solderability

The solderability of samples was tested using a solder dip test, using Alpha NR300F flux.

EXAMPLE 1

The compound of the formula:

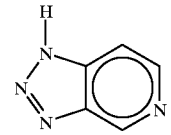

namely 1 H-1,2,3-triazolo[4,5-c]pyridine was tested as detailed above and the following results were obtained as detailed in Table 1 below:

TABLE 1

| | pH Range of Coating Solution | | | | | |
|---|---|---|---|---|---|---|
| TEST PROCEDURE | pH3 | pH4 | pH4.5 | pH5 | pH6.0 | pH6.5 |
| 1. Heat treatment | satisfactory | good | good | good | good | good |
| 2. Solderability | — | good | good | good | good | good |
| 3. Humidity Test | — | poor | satisfactory/poor | satisfactory/poor | poor | poor |

EXAMPLE 2

The compound of the formula:

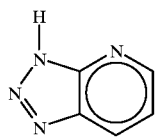

namely 1 H-1,2,3-triazolo[4,5-b]pyridine was tested as detailed above and the following results were obtained as detailed in Table 2 below:

TABLE 2

| TEST PROCEDURE | pH Range of Coating Solution | | | |
|---|---|---|---|---|
|  | pH3 | pH4 | pH7 | pH11 |
| 1. Heat treatment | good | good | good | good |
| 2. Solderability | good | good | g6od | good |

EXAMPLE 3

Purine was tested as detailed above and the following results were obtained as detailed in Table 3 below:

TABLE 3

| Test Procedure | pH Range of Coating Solution | | | | | | |
|---|---|---|---|---|---|---|---|
|  | pH2.5 | pH4.5 | pH6 | pH8 | pH9 | pH10 | pH10.5 |
| 1. Heat treatment | satis-factory | good | good | good | good | good | good |
| 2. Solderability | good | good | good | good | good | good | good |
| 3. Humidity test | good | good | good | good | good | good | good |
| 4. Heat treatment of (3) | good | good | good | good | good | good | good |
| 5. Solderability of (4) | good | good | good | good | good | good | good |

EXAMPLE 4

6-Aminopurine was tested as detailed above and the following results were obtained as detailed in Table 4 below:

TABLE 4

| Test Procedure | pH Range of Coating Solution | | | | | | |
|---|---|---|---|---|---|---|---|
|  | pH2.5 | pH3.5 | pH4 | pH5 | pH6 | pH8 | pH11 |
| 1. Heat treatment | satis-factory | satis-factory | good | good | good | good | good |
| 2. Solderability | satis-factory | good | good | good | good | good | good |

EXAMPLE 5

6-Chloropurine was tested as detailed above and the following results were obtained as detailed in Table 5 below:

TABLE 5

| Test Procedure | pH Range of Coating Solution | | | |
|---|---|---|---|---|
|  | pH2.5 | pH4.5 | pH8 | pH11 |
| 1. Heat treatment | insol | satis-factory/good | Satis-factory/good | poor |
| 2. Solderability |  | satis-factory/good | satis-factory/good | poor |

EXAMPLE 6

2, 6-Dichloropuine was tested as detailed above and the following results were obtained as detailed in Table 6 below:

TABLE 6

| Test Procedure | pH Range of Coating Solution | | | |
|---|---|---|---|---|
|  | pH2.5 | pH4.5 | pH7 | pH11 |
| 1. Heat treatment | insol | satis-factory/good | satis-factory/good | satis-factory/good |
| 2. Solderability |  | satis-factory/good | satis-factory/good | good |

EXAMPLE 7

A coating solution was made up by dissolving or forming a suspension of purine (0.5%) in water (99.5%). The pH of the solution was then adjusted to 2.5 with formic acid and readjusted to the required pH with ammonia solution.

The solution was tested according to the general procedure as detailed above and the following results were obtained.

| TEST PROCEDURE | pH Range of Coating Solution | | |
|---|---|---|---|
|  | pH7 | pH8 | pH9 |
| 1. Heat treatment | good | good | good |
| 2. Solderability | good | good | good |
| 3. Humidity test | good | good | good |
| 4. Heat treatment of (3) | good | good | good |
| 5. Solderability of (4) | good | good | good |

EXAMPLE 8

A coating solution was made up by dissolving or forming a suspension of 6-methoxypurine (0.5%) in water (99.5%). The pH of the solution was then adjusted to 2.5 with formic acid and readjusted to the required pH with ammonia solution.

The solution was then tested according to the general procedure as detailed above and the following results were obtained.

| TEST PROCEDURE | pH Range of Coating Solution | | |
|---|---|---|---|
| | pH7 | pH8 | pH9 |
| 1. Heat treatment | good | good | good |
| 2. Solderability | good | good | good |
| 3. Humidity test | good | good | good |
| 4. Heat treatment of (3) | good | good | good |
| 5. Solderability of (4) | good | good | good |

EXAMPLE 9

A coating solution was made up by dissolving 6-histaminopurine (0.5%) in water (99.5%). The pH of the solution was then adjusted to 2.5 with formic acid and readjusted to the required pH with ammonia solution.

The solution was then tested according to the general procedure as above and the following results were obtained.

| Test Procedure | pH Range of Coating Solution | | | | | | | |
|---|---|---|---|---|---|---|---|---|
| | pH 3 | pH 4 | pH 4.5 | pH 5 | pH 6 | pH 6.5 | pH 7 | PH 8 |
| 1. Heat treatment | poor | poor | poor | satisfactory | satisfactory | satisfactory | excellent | excellent |
| 2. Solderability | poor | poor | poor | satisfactory | satisfactory | satisfactory | excellent | excellent |
| 3. Humidity test | good | good | good | good | good | good | excellent | excellent |
| 4. Solderability | good | good | good | good | good | good | excellent | excellent |
| 5. Heat treatment of (3) | poor | poor | poor | satisfactory | satisfactory | satisfactory | excellent | excellent |
| 6. Solderability of (5) | poor | poor | poor | satisfactory | satisfactory | satisfactory | excellent | excellent |

What is claimed is:

1. A process for the corrosion protection of copper or copper alloy which process comprises contacting the surface with an aqueous solution of at least one compound of the general formula:

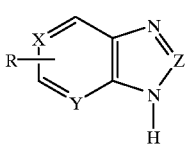

(I)

wherein X is N, Y is CR and Z is N, or X is N, Y is N and Z is N or CR, or X is CR, Y is N and Z is N, where R is a hydrogen atom or $R^1$, and $R^1$ is an alkyl, aryl, aralkyl, halogen, trihalomethyl, amino, heterocyclic, $NHR^2$, $NR^3R^4$, CN, $CO_2H$, $CO_2R^5$, OH or $OR^6$ group, where each of $R^2$ to $R^6$ independently represents an alkyl, aryl or aralkyl group.

2. A process as claimed in claim 1 wherein the compound of the general formula (I) is

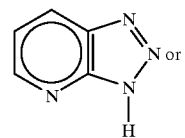

(II)

or

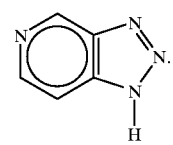

(III)

3. A process as claim in claim 1 wherein the compound of the general formula (I) is purine, 6-aminopurine, 6-chloropurine, 2,6-dichloropurine, 6-methoxypurine, 6-histamino purine and 6-furfuryl-aminopurine.

4. A process as claimed in claim 1 wherein the aqueous solution comprises an organic or inorganic acid.

5. A process as claimed in claim 4 wherein the organic acid is acetic acid, acrylic acid, adipic acid, benzoic acid, citric acid, 2-dimethylol propionic acid, formic acid, fumaric acid, maleic acid, oxalic acid, propionic acid, salicylic acid, succinic acid or tartaric acid.

6. A process as claimed in claim 4 wherein the organic acid is hydrochloric acid, nitric acid, phosphoric acid or sulfuric acid.

7. A process as claimed in claim 1 wherein the aqueous solution is buffered by the addition of ammonia, an amine, a tetraalkyl ammonium hydroxide, an alkali metal hydroxide, a phosphate or a borate.

8. A process as claimed in claim 1 wherein the aqueous solution is applied to the surface of the copper or copper alloy by immersion or spraying.

9. A process as claimed in claim 1 wherein the aqueous solution additionally includes therein a titanium, vanadium, chromium, manganese, iron, cobalt, nickel or zinc salt in an amount of form 0.01 to 10% by weight.

10. A process as claimed in claim 1 wherein the surface to be treated is the surface of a rigid or flexible printed circuit board.

11. A rigid or flexible circuit board which has been subjected to a preflux treatment according to a process as claimed in claim 1.

* * * * *

UNITED STATES PATENT AND TRADEMARK OFFICE
CERTIFICATE OF CORRECTION

PATENT NO. : 6,158,491  
DATED : December 12, 2000  
INVENTOR(S) : Reynolds et al.

Page 1 of 1

It is certified that error appears in the above-identified patent and that said Letters Patent is hereby corrected as shown below:

Claim 2,
Lines 10 to 22, move the word "or" from its present location shown below,

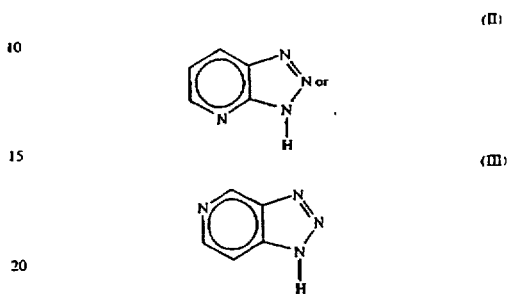

to the location shown below:

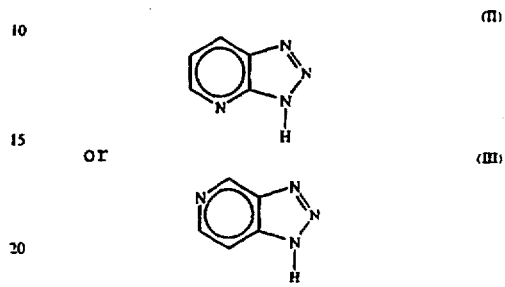

Signed and Sealed this

Fifth Day of February, 2002

Attest:

*Attesting Officer*

JAMES E. ROGAN
*Director of the United States Patent and Trademark Office*